US010790290B2

(12) United States Patent
Daycock et al.

(10) Patent No.: US 10,790,290 B2
(45) Date of Patent: Sep. 29, 2020

(54) 3D NAND WITH INTEGRAL DRAIN-END SELECT GATE (SGD)

(71) Applicant: INTEL CORPORATION, Santa Clara, CA (US)

(72) Inventors: David A. Daycock, Boise, ID (US); Purnima Narayanan, Boise, ID (US); John Hopkins, Boise, ID (US); Guoxing Duan, Boise, ID (US); Barbara L. Casey, Meridian, ID (US); Christopher J. Larsen, Boise, ID (US); Meng-Wei Kuo, Boise, ID (US); Qian Tao, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 15/721,224

(22) Filed: Sep. 29, 2017

(65) Prior Publication Data
US 2019/0103410 A1  Apr. 4, 2019

(51) Int. Cl.
| H01L 27/11524 | (2017.01) |
| H01L 27/1157 | (2017.01) |
| H01L 21/8234 | (2006.01) |
| H01L 27/11582 | (2017.01) |
| H01L 27/11556 | (2017.01) |

(52) U.S. Cl.
CPC ............ *H01L 27/11524* (2013.01); *H01L 21/823412* (2013.01); *H01L 21/823418* (2013.01); *H01L 27/1157* (2013.01); *H01L 27/11556* (2013.01); *H01L 27/11582* (2013.01)

(58) Field of Classification Search
CPC .... H01L 27/11; H01L 27/115; H01L 27/1152; H01L 27/11524; H01L 27/1155; H01L 27/11556; H01L 27/1157; H01L 27/1158; H01L 27/11582; H01L 21/82; H01L 21/823; H01L 21/8234; H01L 21/82341; H01L 21/823412
USPC ........................................................ 257/314
See application file for complete search history.

(56) References Cited

U.S. PATENT DOCUMENTS

| 9,265,143 B2 * | 2/2016 | Bellaiche ............. H05K 1/0289 |
| 2016/0126311 A1 * | 5/2016 | Simsek-Ege ...... H01L 27/11582 257/314 |

\* cited by examiner

*Primary Examiner* — Monica D Harrison
(74) *Attorney, Agent, or Firm* — Compass IP Law PC

(57) ABSTRACT

A 3D NAND storage device includes a plurality of layers containing doped semiconductor material interleaved with a plurality of layers of dielectric material. Each of the pillars forming the 3D NAND storage device includes a plurality of memory cells and a drain-end select gate (SGD). The pillars are separated by a hollow channel in which a plurality of film layers, including at least a lower film layer and an upper film layer have been deposited. The systems and methods described herein remove at least the upper film layer proximate the SGD while maintaining the film layers proximate the memory cells. Such an arrangement beneficially permits tailoring the film layers proximate the SGD prior to depositing the channel film layer in the hollow channel. The systems and methods described herein permit the deposition of a continuous channel film layer proximate both the memory cells and the SGD.

9 Claims, 7 Drawing Sheets

3D NAND WITH INTEGRAL DRAIN-END SELECT GATE (SGD)

TECHNICAL FIELD

The present disclosure relates to three-dimensional NAND memory structures.

BACKGROUND

Memory devices are used to store data or programs used by processor-based devices such as laptops, smartphones, wearable devices, and handheld computers. Concurrent with the trend towards increasingly smaller portable computing devices such a smartphones and wearables is a user emphasis placed on improved system responsiveness, speed, and functionality. To provide such responsiveness, speed, and functionality, semiconductor-based flash memory is frequently used. Such flash memory has traditionally employed two-dimensional (i.e., planar) NAND storage devices. Upon reaching practical storage density achievable using 2D NAND flash devices, three-dimensional NAND (3D NAND) has taken a lead role in increasing storage capacity and storage density in small form factor devices such as portable electronic devices.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
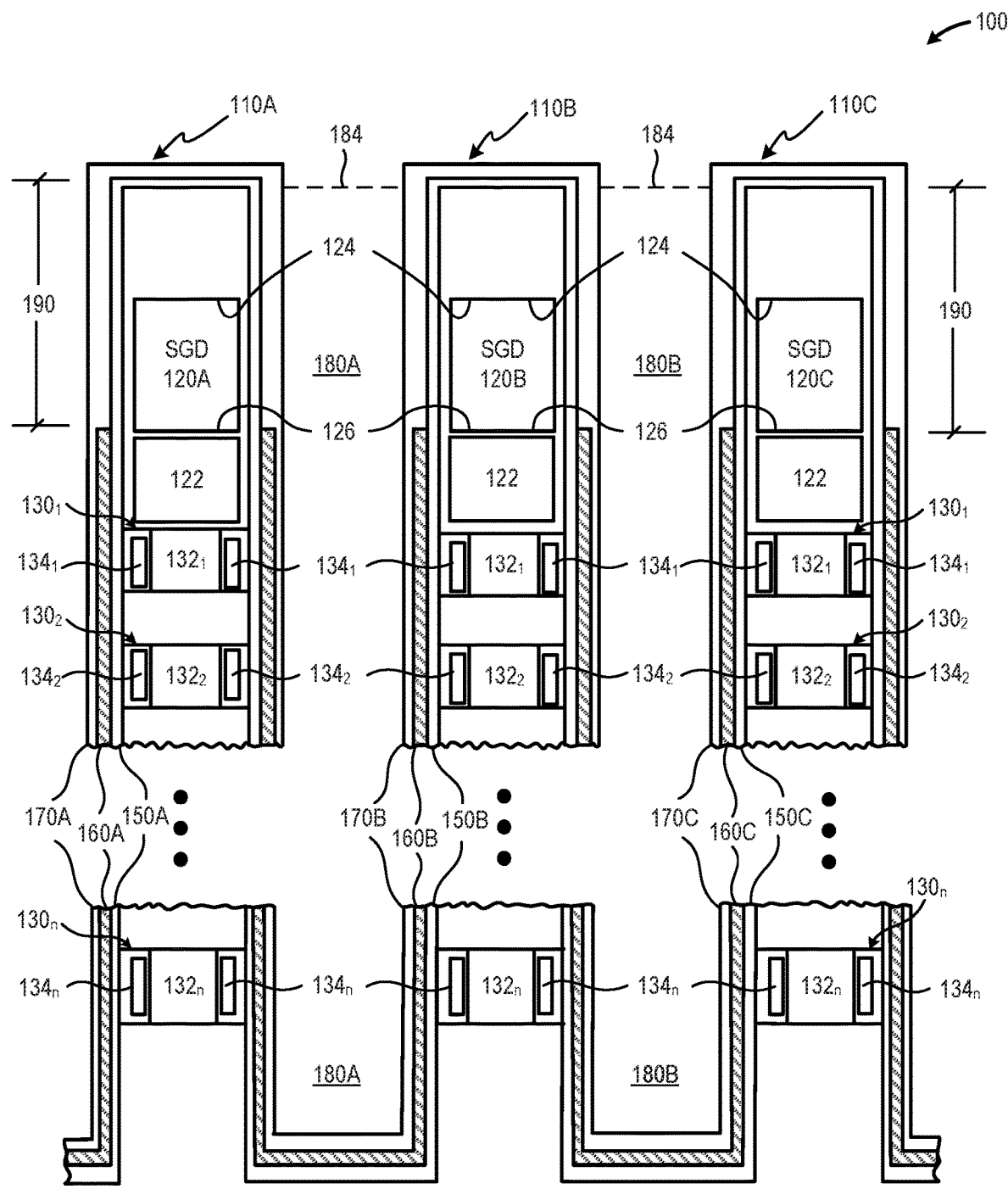
FIG. 1 is a cross-sectional elevation of a portion of an illustrative three-dimensional NAND (3D NAND) structure that includes three pillars in which the upper film layers have been selectively removed proximate select gates to a first defined depth to provide a more uniform, smooth, and consistent channel film layer, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

A three-dimensional NAND ("3D NAND") memory structure may be fabricated by depositing alternating conductive and dielectric layers to form a laminated structure or stack. In some implementations, a plurality of hollow channels are formed (e.g., by high aspect ratio etching, drilling, or similar) in the laminated structure after deposition of the conductive and dielectric layers that form the basis of the 3D NAND structure. Etching and deposition processes may be used to create memory cells, and upper/lower select gates, and similar structures in at least some of the conductive layers within the stack. Various films or layers (e.g., charge trap layers, charge block layers, tunneling layers, oxide layers inter-poly dielectric layers, and similar) may be deposited during and/or after the formation of the memory cells and select gates. A polysilicon channel film layer may be formed on the interior surface of each of the hollow channels. Previously, a select gate layer would be formed on the uppermost dielectric layer after formation of the memory cells and floating gates and the deposition of the polysilicon channel layer. Additional film layers, including the polysilicon channel film layer would then be deposited on the surface of the SGD. While this fabrication technique permits the deposition of desired layers or films on the SGD, it increases both the time and cost of producing the resultant 3D NAND structure.

The systems and methods described herein beneficially and advantageously permit the deposition of the SGD layer immediately following the deposition of the alternating conductive and dielectric layers forming the 3D NAND structure and prior to the deposition of a plurality of film layers in the hollow channels formed in the 3D NAND structure. Such fabrication reduces production time and cost by eliminating the additional SGD deposition steps AFTER depositing the channel layer proximate the memory cells. Such also improves the consistency and/or uniformity of the channel layer thickness and improves the reliability of the overall 3D NAND structure, reducing both cost and rework.

The systems and methods disclosed herein provide improved three-dimensional NAND (3D NAND) memory performance by improving the formation of the SGD by increasing SGD sidewall dielectric uniformity, and channel smoothness. Furthermore, the systems and methods described herein also improve the topmost word line trap-to-band (TB) tunneling between the SGD and the topmost cell in the pillar.

The systems and methods herein include forming the SGD after the deposition of the alternating conductive and dielectric layers forming the stack and prior to the deposition of film layers in the hollow channels formed in the stack. The systems and methods disclosed herein include the deposition of a plurality of film layers that includes at least an upper film layer and a lower film layer after the formation of the SGD such that the upper film layer and the lower film layer are proximate the surface of the SGD. The systems and methods described herein further include the deposition of a removeable material in each of the plurality of hollow channels formed in the 3D NAND stack. The sacrificial material may be planarized and selectively removed to a defined depth from each of the plurality of hollow channels. In some instances, the defined depth may be approximately equal to the bottom of the polysilicon layer containing the SGD. Removal of the sacrificial material exposes the upper film layer in the portion of the hollow channel proximate the SGD. Removal of the exposed portion of at least the upper film layer results in the lower film layer remaining proximate the SGD while both the upper and lower film layers remain proximate the memory cells along the hollow channel.

After removing the exposed portion of the upper film layer, the remaining sacrificial material may be removed from the hollow channel. A continuous channel film layer, proximate both the memory cells and the SGD may be deposited in the hollow channel. The prior deposition of the SGD layer beneficially and advantageously permits the deposition of a relatively uniform channel film layer having a consistent thickness and smoothness across both the memory cells and the SGD lining the hollow channel. A dielectric channel fill material may be deposited in each the plurality of hollow channels after the deposition of the channel film layer. Although only two film layers (i.e., the upper film layer and the lower film layer) are used in the above discussion for clarity and conciseness, those of skill in the relevant arts will readily appreciate any number of film layers may be deposited in the hollow channel. Similarly, although only the "upper film layer" proximate the SGD is removed in the above discussion, those of skill in the relevant arts will readily appreciate any number of film layers proximate the SGD may be removed in addition to the upper film layer.

A method of fabricating a three-dimensional NAND (3D NAND) structure is provided. The method may include: disposing a plurality of films across at least an interior surface of a hollow channel, the hollow channel having an open first end and a closed second end and including: a plurality of memory cells disposed along at least a portion of a length of the hollow channel; and at least one drain-end select gate (SGD) disposed about the hollow channel; disposing a sacrificial material in the hollow channel; selectively removing the sacrificial material to a first defined depth measured from the first end of each of the plurality of hollow channels, selectively removing the sacrificial material to expose an upper film layer included in the plurality of film layers; selectively removing at least the exposed upper film layer included in the plurality of film layers to the first defined depth; and removing the sacrificial material from the hollow channel.

A three-dimensional NAND (3D NAND) structure is provided. The structure may include: a plurality of memory cells disposed about at least a portion of a length of a hollow channel, the hollow channel having at least an open first end and a second end; a drain-end select gate (SGD) formed about the hollow channel; a plurality of film layers that includes at least an upper film layer and a lower film layer disposed across at least a portion of an interior surface of the hollow channel; wherein to a first defined depth measured from the first end of the hollow channel, the plurality of film layers comprises the plurality of film layers less the upper film layer; and wherein beyond the first defined depth, the plurality of film layers includes at least the upper film layer and the lower film layer; and a continuous channel film layer that extends from the first end of the channel to the second end of the channel.

A system for fabricating a three-dimensional NAND (3D NAND) structure is provided. The system may include: means for disposing a plurality of film layers across at least an interior surface of a hollow channel, the hollow channel having an open first end and a closed second end and including: a plurality of memory cells disposed along at least a portion of a length of the hollow channel; and at least one drain-end select gate (SGD) disposed about the hollow channel; means for disposing a sacrificial material in the hollow channel; means for selectively removing the sacrificial material to a first defined depth measured from the first end of each of the plurality of hollow channels to expose an upper film layer included in the plurality of film layers; means for selectively removing at least the exposed upper film layer included in the plurality of film layers to the first defined depth; and means for removing the sacrificial material from the hollow channel.

An electronic device is provided. The electronic device may include: a printed circuit board; and a three-dimensional NAND (3D NAND) structure operably coupled to the printed circuit board, the three-dimensional NAND including: a plurality of memory cells disposed along at least a portion of a length of a hollow channel, the hollow channel having an open first end and a closed second end; at least one drain-end select gate (SGD) disposed about the hollow channel; and a plurality of film layers that includes at least an upper film layer and a lower film layer disposed across at least a portion of an interior surface of the hollow member; where to a first defined depth measured from the first end of the hollow member, the plurality of film layers comprises the plurality of film layers less the upper film layer; and where beyond the first defined depth, the plurality of film layers includes at least the upper film layer and the lower film layer.

As used herein the terms "top," "bottom," "upper," "lower," "lowermost," and "uppermost" when used in relationship to one or more elements are intended to convey a relative rather than absolute physical configuration. Thus, an element described as an "upper film layer" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 is a cross-sectional elevation of a portion of an illustrative three-dimensional NAND (3D NAND) structure that includes three pillars 110A-110C (collectively, "pillars 110") in which the upper film layers 160A-160C (collectively, "upper film layers 160") have been selectively removed proximate select gates 120A-120C (collectively, "select gates 120" or "SGDs 120") to a first defined depth 190 to provide a more uniform, smooth, and consistent channel film layer 170A-170C (collectively, "channel film layer 170"), in accordance with at least one embodiment described herein. As depicted in FIG. 1, hollow channels 180A-180B (collectively, "hollow channels 180") separate the pillars 110A/110B and 110B/110C, respectively. Each of the pillars 110A-110C includes a respective drain-end select gate 120A-120C that is deposited after the topmost dielectric layer 122 and prior to the deposition of the lower film layers 150A-150C (collectively, "lower film layers 150"), the upper layers 160A-160C, and the channel film layers 170A-170C.

The 3D NAND structure 100 may include 32 or more layers; 64 or more layers; or 128 or more layers. Each of the layers may be deposited on the substrate or a preceding layer using one or more material deposition techniques, such as chemical vapor deposition, physical vapor deposition (PVD), and similar. In embodiments, the conductive layers in the stack may include one or more nitrides, such as silicon nitride or conductive polysilicon. In embodiments, the dielectric layers in the stack may include one or more oxides, such as silicon oxide.

Each of the pillars 110 includes a plurality of memory cells $130_1$-$130_n$ (collectively, "memory cells 130"). Each of the memory cells $130_1$-$130_n$ includes a respective control gate $132_1$-$132_n$ (collectively, "control gates 132") disposed proximate a respective plurality of charge storage structures $134_1$-$134_n$ (collectively, "charge storage structures 134"). In embodiments, the charge storage structures 134 may include doped polysilicon floating gate charge storage structures (i.e., floating gate NAND). In other embodiments, the charge storage structures 134 may include silicon nitride charge trap structures (i.e., charge trap NAND).

Any number and/or combination of films, layers, or film layers may be disposed in the hollow channels 180A-180B that separate the pillars 110. Such layers may include, at a minimum, a lower film layer 150A-150B (collectively, "lower film layer 150") and an upper film layer 160A-160B (collectively, "upper film layer 160"). As depicted in FIG. 1, in embodiments, at least a portion of the upper film layer 160 may be selectively removed from the hollow channel 180 to a first defined depth 190. In some implementations, the first defined depth 190 may be greater than the depth to the upper surface 124 of the SGD 120 and less than the depth to the lower surface 126 of the SGD 120. In some implementations, the first defined depth 190 may be approximately equal to the depth to the lower surface 126 of the SGD 120. In some implementations, the first defined depth 190 may be greater than the depth of the lower surface of the SGD 120.

The lower film layer 150 may include, but is not limited to, one or more of the following: dielectric layers, oxide layers, nitride layers, charge blocking layers, charge storage layers, and/or insulative tunneling layers. The upper film layer 160 may include, but is not limited to, one or more of the following: dielectric layers, oxide layers, nitride layers, charge blocking layers, charge storage layers, and/or insulative tunneling layers. Although described in terms of a lower film layer 150 and an upper film layer 160 for clarity and conciseness, those of skill in the relevant arts will readily appreciate any number of additional film layers may be disposed between the lower film layer 150 and the upper film layer 160. In such instances, removal of the upper film layer 160 should be considered to include "removal of at least the upper film layer 160" since additional underlying film layers may be removed as well without departing from the embodiments described herein.

A channel film layer 170 may be disposed in, on, across, or about the hollow channel 180. In embodiments, the channel film layer 170 may include, but is not limited to, a doped polysilicon layer or an undoped polysilicon layer. In embodiments, the channel film layer 170 may include, but is not limited to, one or more semiconductor materials, such as indium-gallium-arsenide (InGaAs). The channel film layer 170 may be deposited or otherwise formed on the inner surfaces of the hollow channel 180 as a continuous, uninterrupted layer that traverses both the portion of the hollow channel occupied by memory cells 130 and by the SGD 120. The channel film layer 170 may be deposited using any currently available or future developed material deposition process or method. The channel film layer 170 may have an average thickness ($T_{avg}$) measured from the first end to the second end of the hollow channel 180. In embodiments, the actual thickness of the channel film layer 170 may vary from the average thickness by less than: $+/-5\%$ $T_{avg}$; $+/-10\%$ $T_{avg}$; $+/-15\%$ $T_{avg}$; $+/-20\%$ $T_{avg}$; or $+/-25\%$ $T_{avg}$.

Figure 2A:
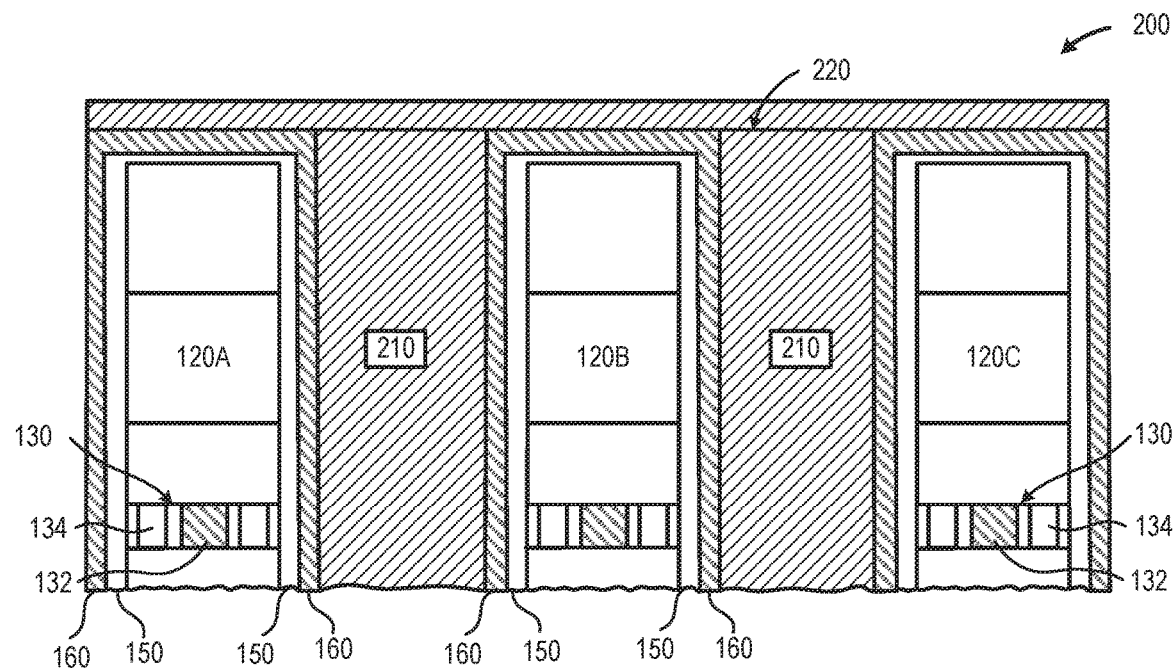
FIG. 2A is a cross-sectional elevation of an illustrative 3D NAND structure in which a sacrificial material is disposed in each of a plurality of hollow channels and across the upper surface of the 3D NAND structure, in accordance with at least one embodiment described herein.

FIGS. 2A-2E depict an illustrative three-dimensional NAND (3D NAND) fabrication method 200A-200E in which the SGD 120 in each pillar 110 is deposited on the uppermost dielectric layer 122 after the deposition of the conductive and dielectric layers forming the 3D NAND structure and in which the channel film layer 170 is deposited as a physically continuous layer across the memory cells 130 in the pillar and the SGD 120, in accordance with at least one embodiment described herein. FIG. 2A is a cross-sectional elevation of an illustrative 3D NAND structure after the deposition of the lower film layer 150 and the upper film layer 160 across the SGD 120 and memory cells 130 formed in each pillar 110, in accordance with at least one embodiment described herein.

FIG. 2A is a cross-sectional elevation of an illustrative 3D NAND structure 200 in which a sacrificial material 210 is disposed in each of a plurality of hollow channels 180 and across the upper surface 220 of the 3D NAND structure 200A, in accordance with at least one embodiment described herein. As depicted in FIG. 2A, after forming the hollow channel 180 (e.g., via high aspect ratio etching or drilling) and depositing the lower film layer 150 and the upper film layer 160 across the 3D NAND structure 100, the sacrificial material 210 is disposed in each of the hollow channels 180 and across the upper surface 220 of the 3D NAND structure 200A. The sacrificial material 210 may include any material capable of disengaging from the upper film layer 160. In one embodiment, the sacrificial material 210 may include an etch resist material. In another embodiment, the sacrificial material 210 may include a spin-on dielectric material.

Figure 2B:
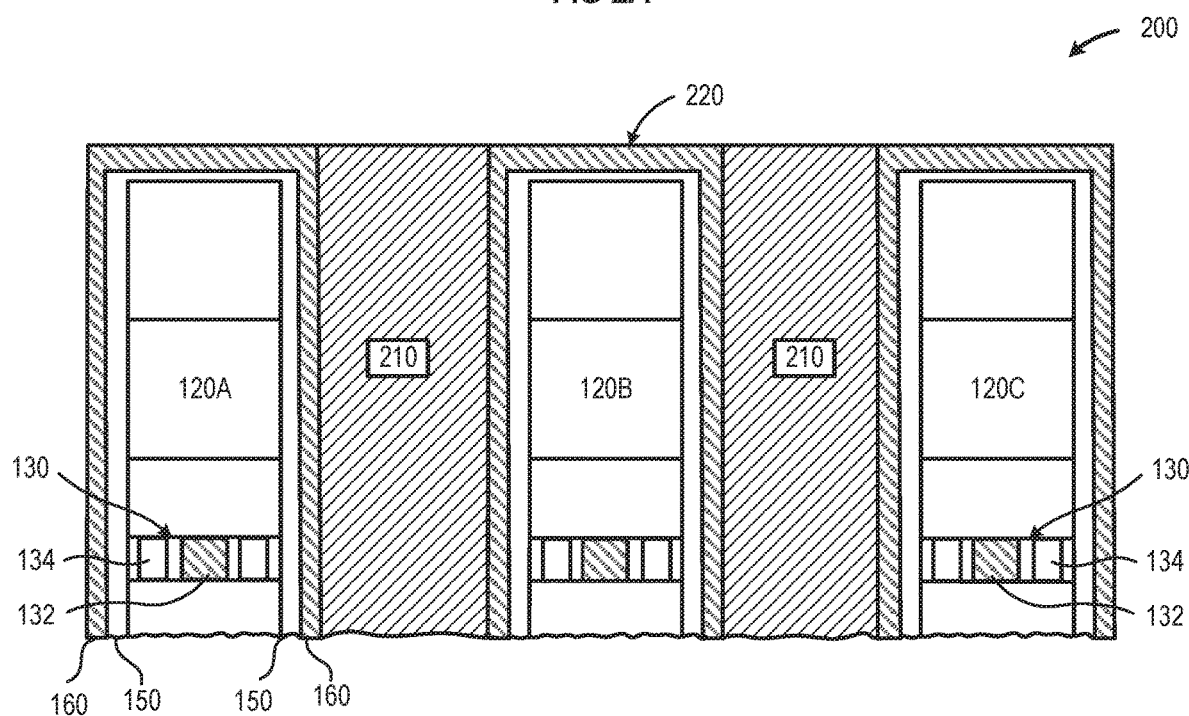
FIG. 2B is a cross-sectional elevation of the illustrative 3D NAND structure depicted in FIG. 2A in which the sacrificial material has been smoothed or planarized such that the upper surface of the sacrificial material is level with the upper surface of the 3D NAND structure, in accordance with at least one embodiment described herein.

FIG. 2B is a cross-sectional elevation of the illustrative 3D NAND structure depicted in FIG. 2A in which the sacrificial material 210 has been smoothed or planarized such that the upper surface of the sacrificial material 210 is level with the upper surface 220 of the 3D NAND structure 200, in accordance with at least one embodiment described herein. Planarizing the sacrificial material 210 beneficially and advantageously provides greater uniformity of depth in the hollow channels 180 in subsequent sacrificial material removal processing. The sacrificial material 210 may be planarized using any currently available or future developed planarization process. In embodiments, the sacrificial material 210 may be removed using chemical-mechanical planarization (CMP) process or method.

Figure 2C:
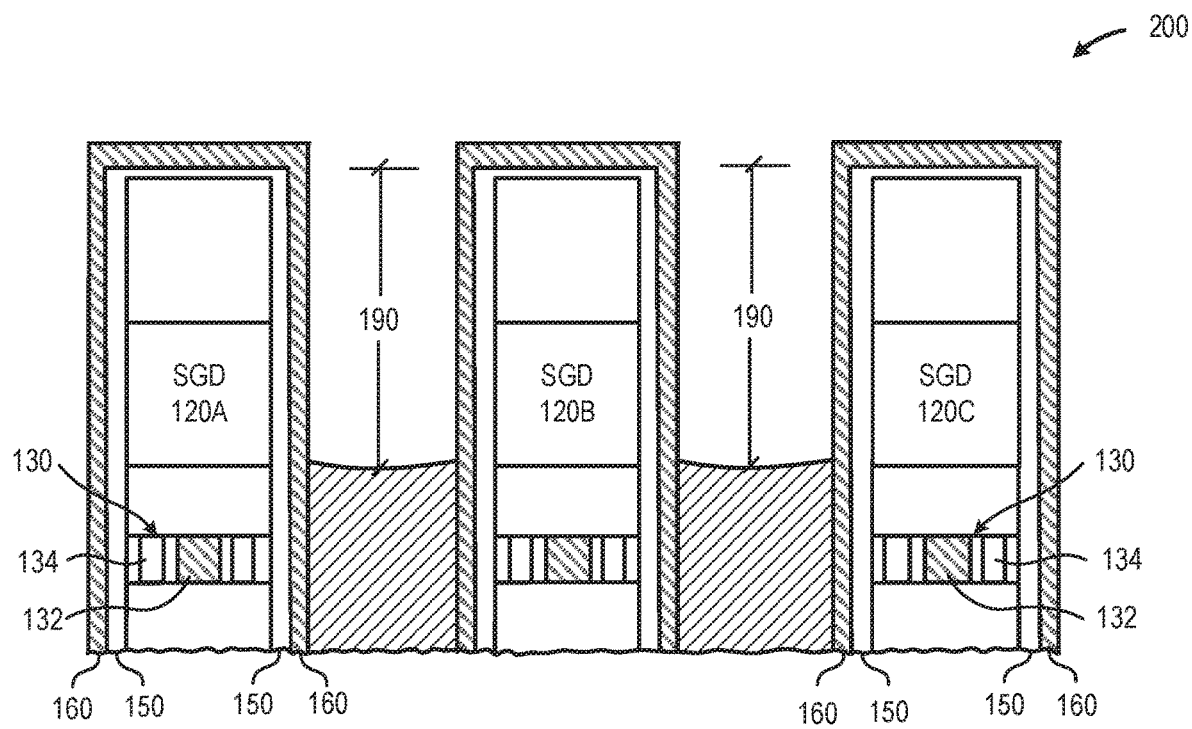
FIG. 2C is a cross-sectional elevation of the illustrative 3D NAND structure depicted in FIG. 2B in which the sacrificial material has been removed from the hollow channels to a first defined depth measured from the upper surface of the 3D NAND structure, in accordance with at least one embodiment described herein.

FIG. 2C is a cross-sectional elevation of the illustrative 3D NAND structure depicted in FIG. 2B in which the sacrificial material 210 has been removed from the hollow channels 180 to a first defined depth 190 measured from the upper surface 220 of the 3D NAND structure 200, in accordance with at least one embodiment described herein. Removal of the sacrificial material 210 from the hollow channels 180 exposes the upper film layer 160 proximate the SGD 120. The sacrificial material 210 may be removed from the hollow channels 180 using any currently available or future developed material removal process. In embodiments, the sacrificial material 210 may be removed using a wet-etch process.

Figure 2D:
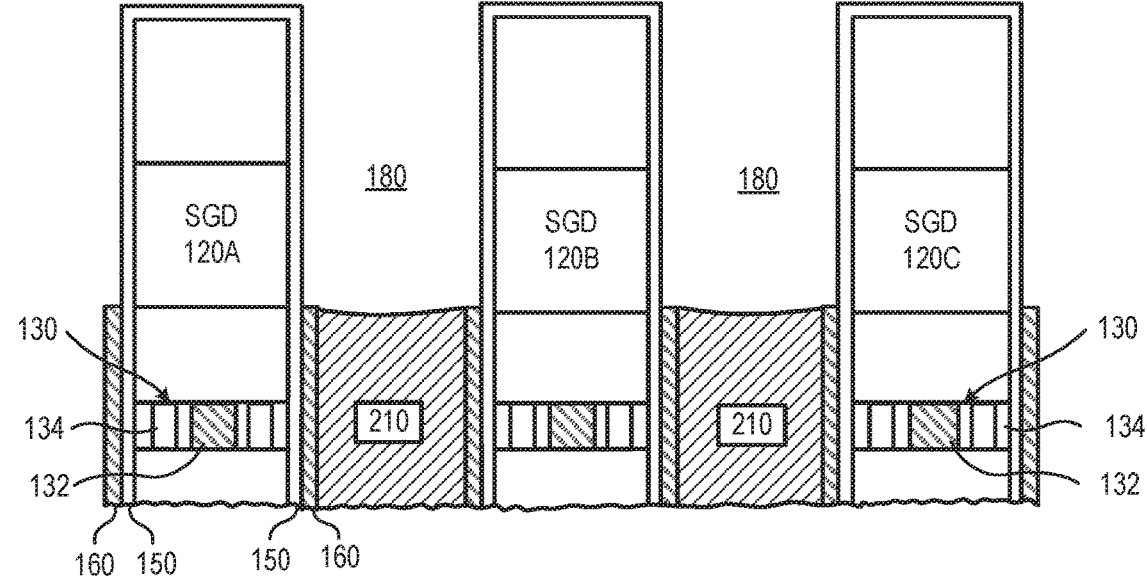
FIG. 2D is a cross-sectional elevation of the illustrative 3D NAND structure depicted in FIG. 2C in which the upper film layer has been removed from the hollow channels to a first defined depth measured from the upper surface of the 3D NAND structure, in accordance with at least one embodiment described herein.
Figure 2E:
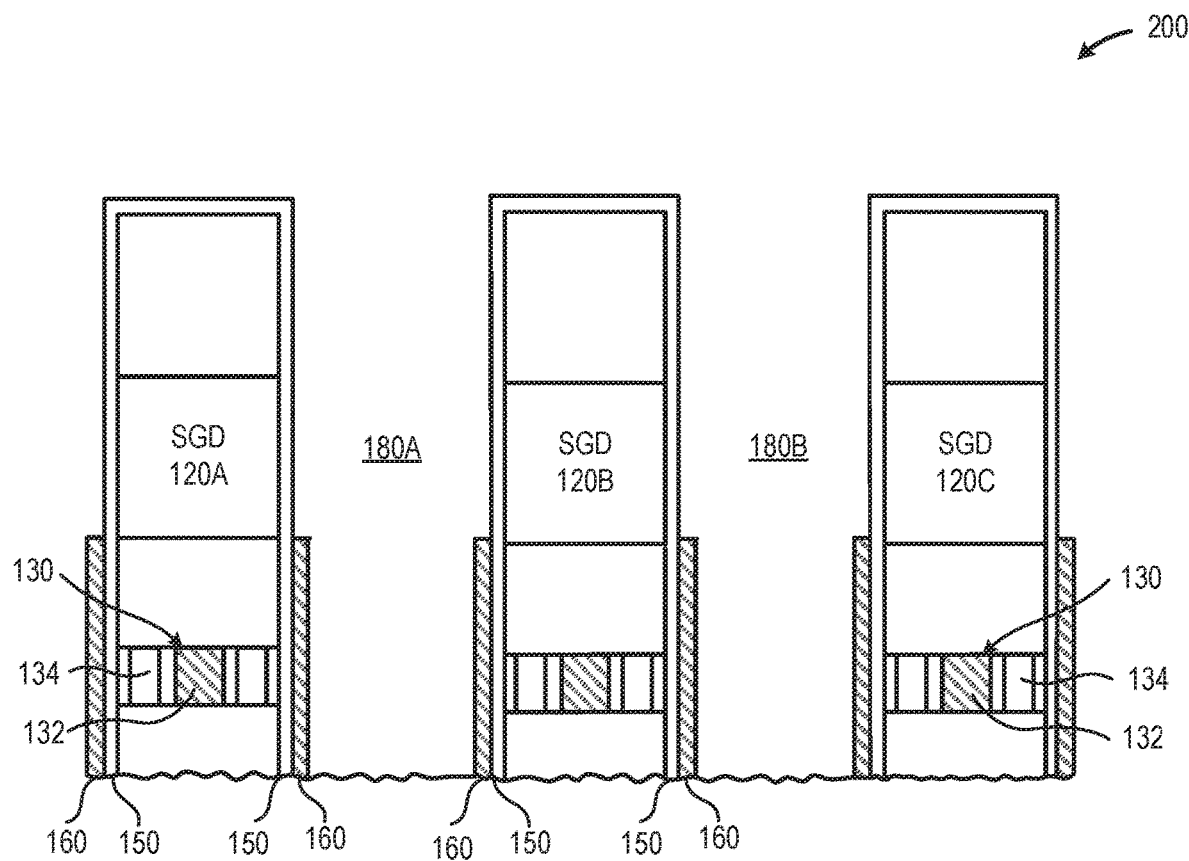
FIG. 2E is a cross-sectional elevation of the illustrative 3D NAND structure depicted in FIG. 2D in which the sacrificial material has been removed from the hollow channels to expose the upper film layer below the drain-end select gate (SGD) and the lower film layer proximate the SGD, in accordance with at least one embodiment described herein.

FIG. 2D is a cross-sectional elevation of the illustrative 3D NAND structure depicted in FIG. 2C in which the upper film layer 160 has been removed from the hollow channels 180 to a first defined depth 190 measured from the upper surface 220 of the 3D NAND structure 200, in accordance with at least one embodiment described herein. Removal of the upper film layer 160 from the hollow channels 180 exposes the lower film layer 150 proximate the SGD 120. The upper film layer 160 may be removed from the lower film layer 150 in the hollow channels 180 using any currently available or future developed material removal process. In embodiments, the upper film layer 160 may be removed using a wet-etch process.

2E is a cross-sectional elevation of the illustrative 3D NAND structure depicted in FIG. 2D in which the sacrificial material 210 has been removed from the hollow channels 180 to expose the upper film layer 160 below the SGD 120 and the lower film layer 150 proximate the SGD 120, in accordance with at least one embodiment described herein. Removal of the sacrificial material 210 from the hollow channels 180 exposes the upper film layer 160 proximate the memory cells 130 in the pillar 110. The sacrificial material 210 may be removed from the hollow channels 180 using any currently available or future developed material removal process. For example, the sacrificial material 210 may be removed from the hollow channels 180 using a wet-etch process.

Figure 3:
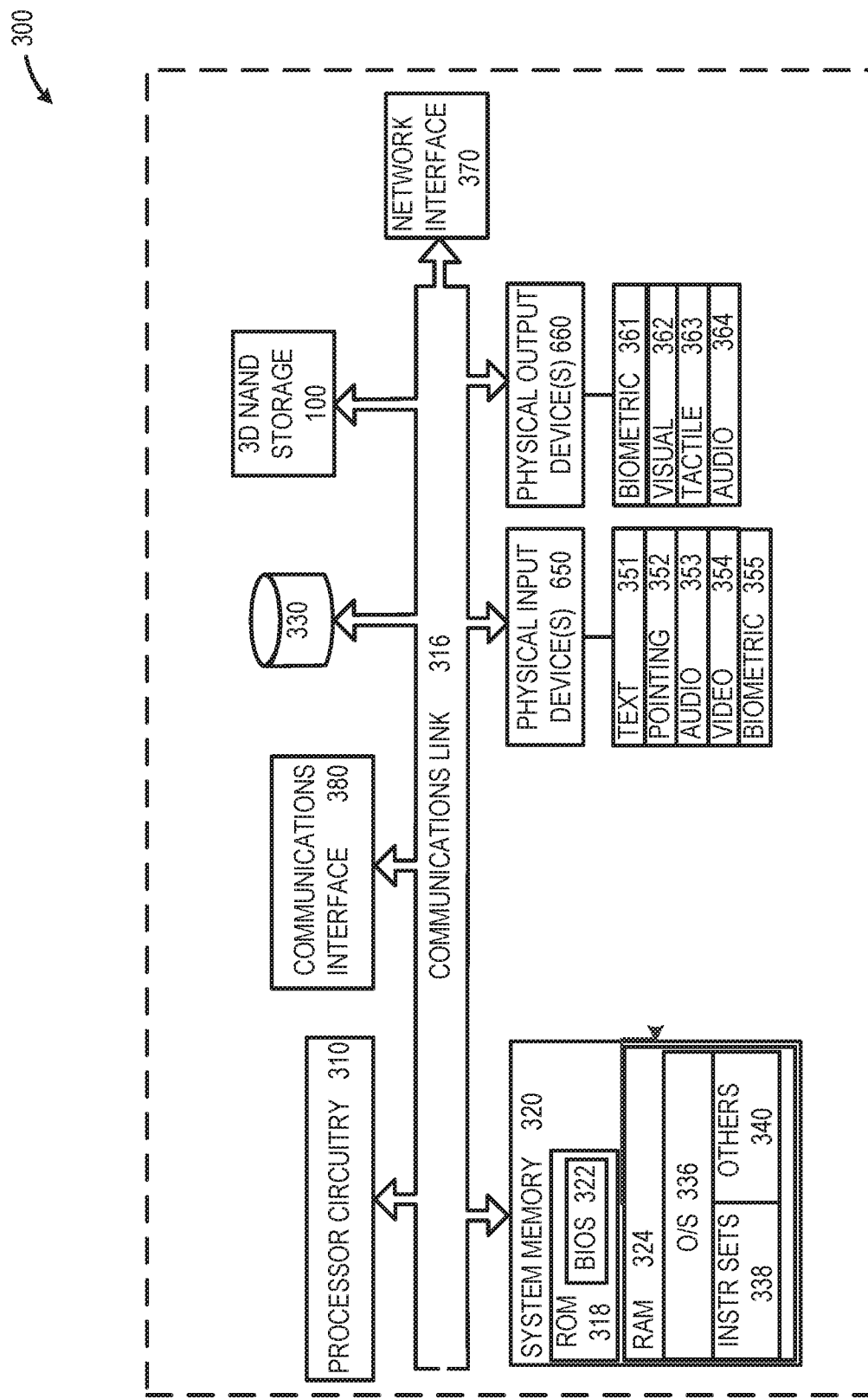
FIG. 3 is a block diagram of an illustrative processor-based device equipped with at least one 3D NAND storage device such as described above in FIGS. 1 and 2A-2E, in accordance with at least one embodiment described herein.

FIG. 3 is a block diagram of an illustrative processor-based device 300 equipped with at least one 3D NAND storage device 100 such as described above with regard to FIGS. 1 and 2A-2E, in accordance with at least one embodiment described herein. The following discussion provides a brief, general description of the components forming the illustrative processor-based device 300 such as a smartphone, wearable computing device, portable computing device, or similar device using a 3D NAND-based semiconductor device, such as the 3D NAND-based storage device 100 having the features depicted in any of FIGS. 1 through 2E.

The processor-based device 300 includes processor circuitry 310 capable of executing machine-readable instruction sets, reading data from the 3D NAND-based storage device 100 and writing data to the 3D NAND-based storage device 100. Those skilled in the relevant art will appreciate that the illustrated embodiments as well as other embodiments can be practiced with other circuit-based device configurations, including portable electronic or handheld electronic devices, for instance smartphones, portable computers, wearable computers, microprocessor-based or programmable consumer electronics, personal computers ("PCs"), network PCs, minicomputers, mainframe computers, and the like.

The processor circuitry 310 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions. The processor-based device 300 includes the processor circuitry 310 and bus or similar communications link 316 that communicably couples and facilitates the exchange of information and/or data between various system components including a system memory 320, one or more rotating data storage devices 330, and/or one or more 3D NAND-based storage devices 100. The processor-based device 300 may be referred to in the singular herein, but this is not intended to limit the embodiments to a single device and/or system, since in certain embodiments, there will be more than one processor-based device 300 that incorporates, includes, or contains any number of communicably coupled, collocated, or remote networked circuits or devices.

Figure 6:
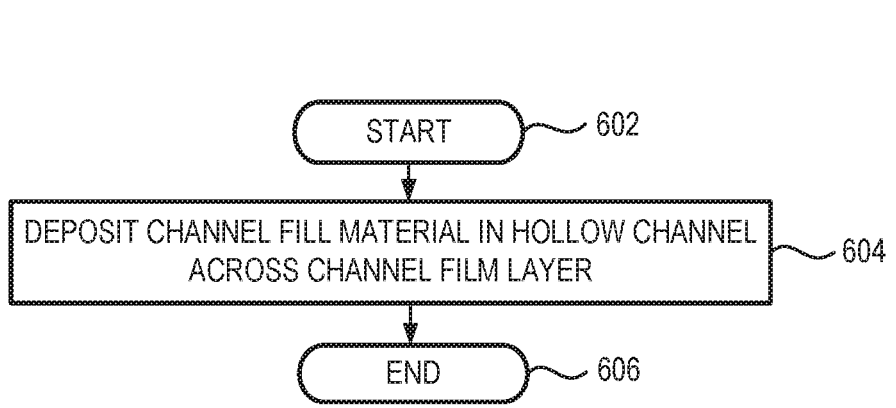
FIG. 6 is a high-level logic flow diagram of an illustrative method of forming a 3D NAND structure that may be used with the method described in FIGS. 4 and 5, in accordance with at least one embodiment described herein.

The processor circuitry 310 may include any number, type, or combination of devices. At times, the processor circuitry 310 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), field programmable gate arrays (FPGAs), and the like. Unless described otherwise, the construction and operation of the various blocks shown in FIG. 6 are of conventional design. Consequently, such blocks need not be described in further detail herein, as they will be understood by those skilled in the relevant art. The communications link 316 that interconnects at least some of the components of the processor-based device 300 may employ any known serial or parallel bus structures or architectures.

The system memory 320 may include read-only memory ("ROM") 318 and random access memory ("RAM") 324. A portion of the ROM 318 may be used to store or otherwise retain a basic input/output system ("BIOS") 322. The BIOS 322 provides basic functionality to the processor-based device 300, for example by causing the processor circuitry 310 to load one or more machine-readable instruction sets. In embodiments, at least some of the one or more machine-readable instruction sets cause at least a portion of the processor circuitry 310 to provide, create, produce, transition, and/or function as a dedicated, specific, and particular machine, for example a word processing machine, a digital image acquisition machine, and similar.

The processor-based device 300 may include one or more communicably coupled, non-transitory, data storage devices, such as one or more hard disk drives 330 and/or one or more 3D NAND-based storage devices 100, such as described in FIGS. 1 and 2A-2E, above. For example, the one or more 3D NAND-based storage devices may include, but is not limited to, a solid-state storage device ("SSD"). The one or more data storage devices 330 may include any current or future developed storage appliances, networks, and/or devices. Non-limiting examples of such data storage devices 330 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 330 may include one or more removable storage devices, such as one or more flash drives, flash memories, flash storage units, or similar appliances or devices capable of communicable coupling to and decoupling from the processor-based device 300.

The one or more data storage devices 330 and/or the one or more 3D NAND-based storage devices 100 may include interfaces or controllers (not shown) communicatively coupling the respective storage device or system to the communications link 316. The one or more data storage devices 330 may store, retain, or otherwise contain machine-readable instruction sets, data structures, program modules, data stores, databases, logical structures, and/or other data useful to the processor circuitry 310 and/or one or more applications executed on or by the processor circuitry 310. In some instances, one or more data storage devices 330 may be communicably coupled to the processor circuitry 310, for example via communications link 316 or via one or more wired communications interfaces (e.g., Universal Serial Bus or USB); one or more wireless communications interfaces (e.g., Bluetooth®, Near Field Communication or NFC); one or more wired network interfaces (e.g., IEEE 802.3 or Ethernet); and/or one or more wireless network interfaces (e.g., IEEE 802.11 or WiFi®)).

Machine-readable instruction sets 338 and other modules 340 may be stored in whole or in part in the system memory 320. Such instruction sets 338 may be transferred, in whole or in part, from the one or more data storage devices 330 and/or the one or more 3D NAND-based storage devices 100. The instruction sets 338 may be loaded, stored, or otherwise retained in system memory 320, in whole or in part, during execution by the processor circuitry 310. The machine-readable instruction sets 338 may include machine-readable and/or processor-readable code, instructions, or similar logic capable of providing the speech coaching functions and capabilities described herein.

A system user may provide, enter, or otherwise supply commands (e.g., selections, acknowledgements, confirmations, and similar) as well as information and/or data (e.g., subject identification information, color parameters) to the processor-based device 300 using one or more communicably coupled input devices 350. The one or more communicably coupled input devices 350 may be disposed local to or remote from the processor-based device 300. The input devices 350 may include one or more: text entry devices 351 (e.g., keyboard); pointing devices 352 (e.g., mouse, trackball, touchscreen); audio input devices 353; video input devices 354; and/or biometric input devices 355 (e.g., fingerprint scanner, facial recognition, iris print scanner, voice recognition circuitry). In embodiments, at least some of the one or more input devices 350 may include a wired or wireless interface that communicably couples the input device 350 to the processor-based device 300.

The system user may receive output from the processor-based device 300 via one or more output devices 360. In at least some implementations, the one or more output devices 360 may include, but are not limited to, one or more: biometric output devices 361; visual output or display devices 362; tactile output devices 363; audio output devices 364, or combinations thereof. In embodiments, at least some of the one or more output devices 360 may include a wired or a wireless communicable coupling to the processor-based device 300.

For convenience, a network interface 370, the processor circuitry 310, the system memory 320, the one or more input devices 350 and the one or more output devices 360 are illustrated as communicatively coupled to each other via the communications link 316, thereby providing connectivity between the above-described components. In alternative embodiments, the above-described components may be communicatively coupled in a different manner than illustrated in FIG. 3. For example, one or more of the above-described components may be directly coupled to other components, or may be coupled to each other, via one or more intermediary components (not shown). In some embodiments, all or a portion of the communications link 316 may be omitted and the components are coupled directly to each other using suitable wired or wireless connections.

Figure 4:
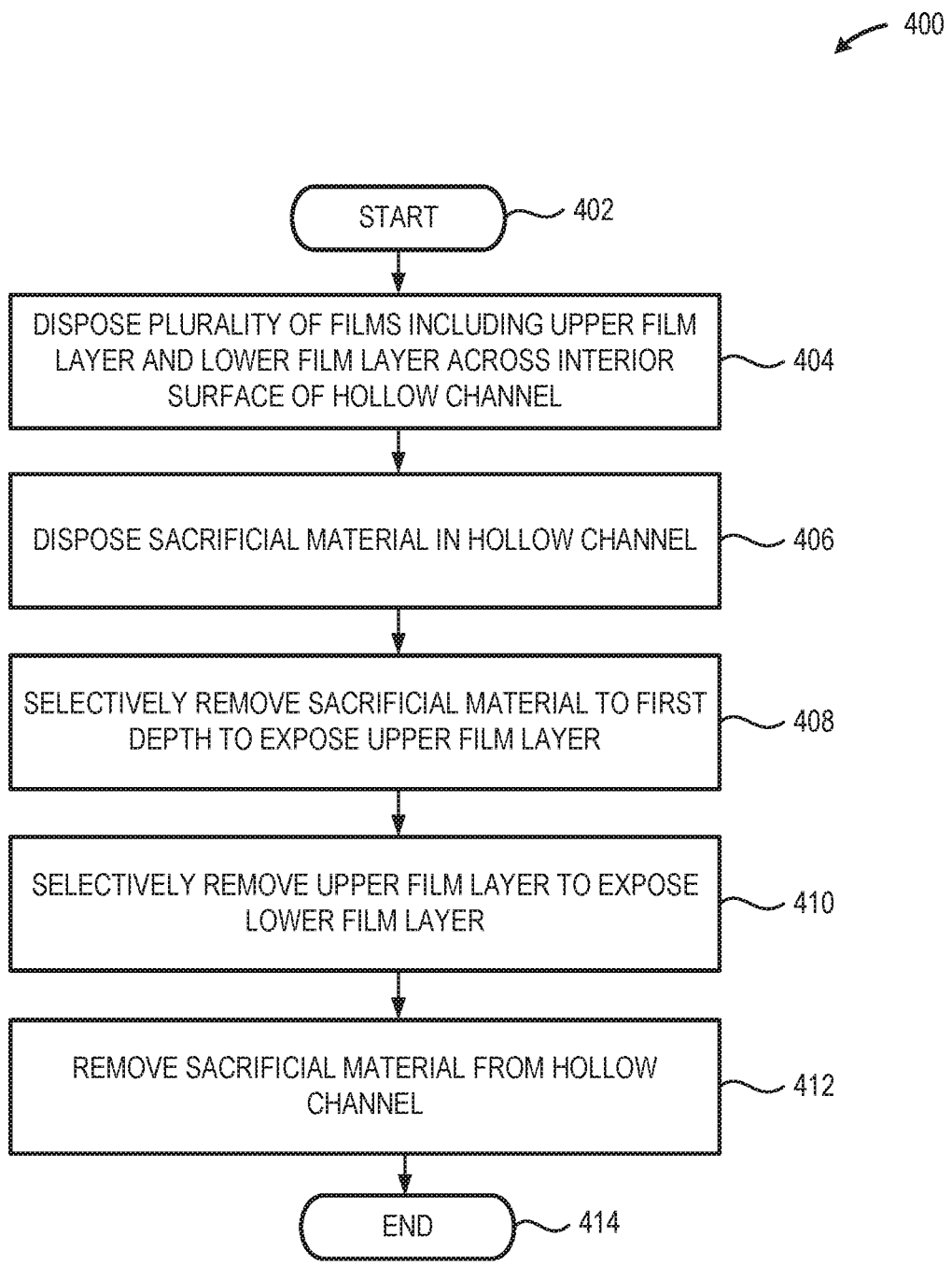
FIG. 4 is a high-level logic flow diagram of an illustrative method of forming a 3D NAND structure, in accordance with at least one embodiment described herein.

FIG. 4 is a high-level logic flow diagram of an illustrative method of forming a 3D NAND structure 100, in accordance with at least one embodiment described herein. In embodiments, the SGD layer may be deposited immediately after the deposition of the alternating conductive and dielectric layers forming the 3D NAND structure 100. Such fabrication reduces the time and cost of production of the 3D NAND structure 100 by eliminating the additional SGD deposition steps AFTER depositing the channel film layer. Such also improves the consistency and/or uniformity of the thickness of the channel film layer 170 thereby improving the reliability of the overall 3D NAND structure, beneficially reducing both cost and rework. The method 400 commences at 402.

At 404, a plurality of film layers, including a lower film layer 150 and an upper film layer 160, may deposited or otherwise formed in, on, about, or across the interior surface of each of a plurality of hollow channels 180 formed in a 3D NAND structure 100. The lower film layer 150 and/or the upper film layer 160 may include, but are not limited to, one or more charge transport layers, one or more charge blocking layers, one or more dielectric layers, one or more oxide layers, one or more nitride layers, one or more charge storage layers, and/or one or more insulative tunneling layers. In embodiments, the lower film layer 150 and/or the upper film layer 160 may be deposited using any currently available or future developed material deposition method or process. Example material deposition methods or processes include, but are not limited to, Available technologies include physical vapor deposition (PVD), chemical vapor deposition (CVD), electrochemical deposition (ECD), molecular beam epitaxy (MBE) and atomic layer deposition (ALD).

At 406, a sacrificial material 210 is deposited in each of the plurality of hollow channels 180. The sacrificial material 210 may include, but is not limited to, one or more materials demonstrating a clean release from the upper film layer 160. Consequently, the sacrificial material 210 may be selected based at least in part on the composition, chemical properties, and/or physical properties of the upper film layer 160. In embodiments, the sacrificial material 210 may include an etch resist. In embodiments, the sacrificial material 210 may include a spin-on dielectric material. The sacrificial material 210 may be deposited in each of the plurality of hollow channels 180 using any currently available or future developed material deposition process or method.

At 408, the sacrificial material 210 is removed from each of the plurality of hollow channels 180 to a first defined depth 190 measured from the upper surface 220 of the 3D NAND structure 100. The sacrificial material 210 may be removed from each of the plurality of hollow channels 180 using any currently available or future developed material removal process or method. For example, the sacrificial material 210 may be removed from each of the plurality of hollow channels using a wet etch process. Removing the sacrificial material 210 from the hollow channels 180 exposes the upper film layer 160 in the region of the hollow channel 180 proximate the SGD 120.

At 410, the upper film layer 160 exposed by removing the sacrificial material 210 at 408 is selectively removed to expose the lower film layer 150 in the region of the hollow channel 180 proximate the SGD 120. The upper film layer 160 remains intact in the lower region of the hollow channel 180 proximate the memory cells 130 and the lower select gate. The exposed upper film layer 160 may be removed using any currently available or future developed material removal process or method. For example, the upper film layer 160 may be removed from each of the plurality of hollow channels 180 using a wet etch process. Removing the upper film layer 160 from the hollow channels 180 exposes the lower film layer 150 in the region of the hollow channel 180 proximate the SGD 120.

At 412, the remaining sacrificial material 210 in the hollow channel 180 is removed. The sacrificial material 210 may be removed from each of the plurality of hollow channels 180 using any currently available or future developed material removal process or method. For example, the sacrificial material 210 may be removed from each of the plurality of hollow channels using a wet etch process. Removing the sacrificial material 210 from the hollow channels 180 exposes the upper film layer 160 in the region of the hollow channel 180 proximate the memory cells 130 and the lower select gate. The method 400 concludes at 414.

Figure 5:
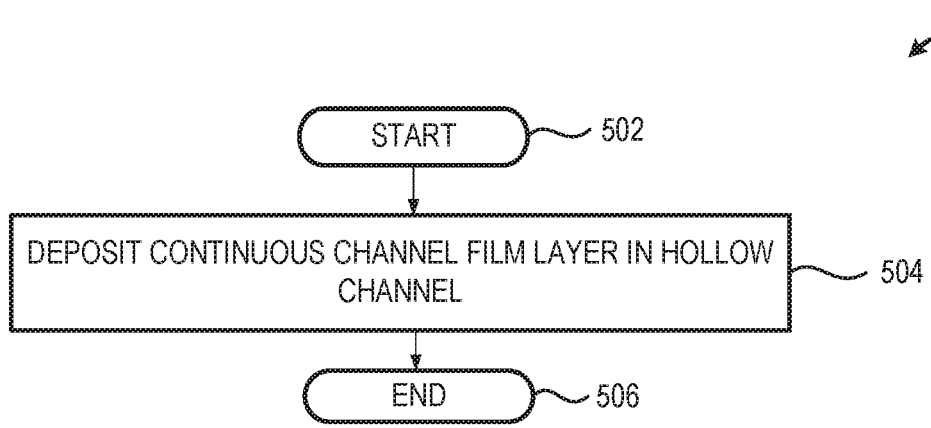
FIG. 5 is a high-level logic flow diagram of an illustrative method of forming a 3D NAND structure that may be used with the method described in FIG. 4, in accordance with at least one embodiment described herein.

FIG. 5 is a high-level logic flow diagram of an illustrative method 500 of forming a 3D NAND structure 100, in accordance with at least one embodiment described herein. The method 500 may be used in conjunction with the method 400 described in detail in FIG. 4. After removal of the sacrificial material 210 from the hollow channel 180, a channel film layer 170 may be deposited on, across, or about the exposed upper film layer 160 proximate the memory cells 130 in each of the hollow channels 180 and on, across, or about the exposed lower film layer 150 proximate the SGD 120. The method 500 commences at 502.

At 504, a channel film layer 170 is deposited on, across, or about some or all of the interior surfaces of some or all of the plurality of hollow channels 180. The channel film layer 170 may be deposited using any currently available or future developed material deposition process or method. In embodiments, the channel film layer 170 may be deposited as a continuous layer extending from the bottom of the hollow channel 180 to the open top of the respective hollow channel 180. In embodiments, deposition of the channel film layer 170 as a continuous layer across the memory cells 130 and the SGD 120 beneficially and advantageously reduces variability in the thickness of the channel film layer 170. The channel film layer 170 may be deposited as continuous layer proximate at least some of the memory cells 130 and extending past the SGD 120. In embodiments, the channel film layer 170 may include one or more poly-silicon film layers. The method 500 concludes at 506.

FIG. 6 is a high-level logic flow diagram of an illustrative method 600 of forming a 3D NAND structure 100, in accordance with at least one embodiment described herein. The method 600 may be used in conjunction with either or both the method 400 described in detail in FIG. 4 and/or the method 500 described in detail in FIG. 5. After removal of the sacrificial material 210 from the hollow channel 180, a channel film layer 170 may be deposited on, across, or about the exposed upper film layer 160 proximate the memory cells 130 in each of the hollow channels 180 and on, across, or about the exposed lower film layer 150 proximate the SGD 120. After depositing the channel film layer 170, each of some or all of the hollow channels 180 may be at least partially filled using a channel fill material. The method 600 commences at 602.

At 604, a channel fill material is deposited in, on, across, or about some or all of the plurality of hollow channels 180. The channel fill material may be deposited using any currently available or future developed material deposition process or method. For example, in one embodiment, the channel fill material may be deposited as a spin-on dielectric material. In embodiments, the channel fill material may be deposited as a continuous column extending from the bottom of the hollow channel 180 to the open top of the respective hollow channel 180. In embodiments, the channel fill material may include one or more dielectric materials. The method 600 concludes at 606.

Figure 7:
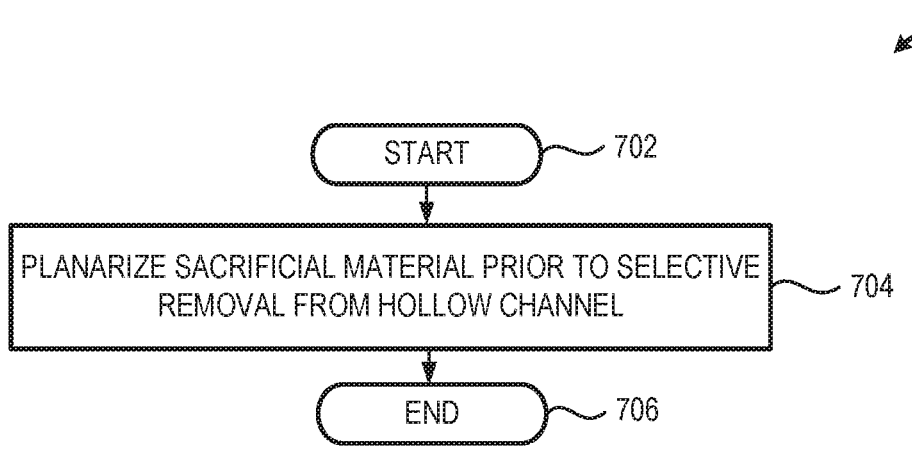
FIG. 7 is a high-level logic flow diagram of an illustrative method 700 of forming a 3D NAND structure that may be used with the method described in FIGS. 4, 5 and/or 6, in accordance with at least one embodiment described herein.

FIG. 7 is a high-level logic flow diagram of an illustrative method 700 of forming a 3D NAND structure 100, in accordance with at least one embodiment described herein. The method 700 may be used in conjunction with some or all of: the method 400 described in detail in FIG. 4, the method 500 described in detail in FIG. 5, and/or the method 600 described in detail in FIG. 6. After deposition of the sacrificial material 210, the upper surface of the sacrificial material 210 may be planarized to improve consistency of the first defined depth 190 of sacrificial material 210 removed from the plurality of hollow channels 180. The method 700 commences at 702.

At 704, the sacrificial material 210 disposed in the hollow channels 180 at 406 may be planarized prior to removing the sacrificial material 210 from the hollow channels 180 to the first defined depth 190. In some implementations, the sacrificial material 210 may be removed and/or planarized to a level equal to the upper surface 220 of the 3D NAND structure 100. The sacrificial material 210 may be planarized using any currently available or future developed planarization process or method. For example, the sacrificial material 210 may be planarized using a mechanical planarization (i.e., grinding) process; a chemical planarization process; or a chemical/mechanical planarization process. The method 700 concludes at 706.

While FIGS. 4 through 7 illustrate various operations according to one or more embodiments, it is to be understood that not all of the operations depicted in FIGS. 4 through 7 are necessary for other embodiments. Indeed, it is fully contemplated herein that in other embodiments of the present disclosure, the operations depicted in FIGS. 4 through 7, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eM-MCs), secure digital input/output (SDIO) cards, magnetic or optical cards, or any type of media suitable for storing electronic instructions. Other embodiments may be implemented as software executed by a programmable control device.

Thus, the present disclosure is directed to 3D NAND data storage systems and methods. In embodiments, a 3D NAND storage device includes a plurality of layers containing doped semiconductor material interleaved with a plurality of layers of dielectric material. Each of the pillars forming the 3D NAND storage device includes a lower select gate, a plurality of memory cells and a drain-end select gate (SGD). The systems and methods described herein beneficially permit the deposition of the SGD immediately following the deposition or formation of the alternating conductive and dielectric layers that form the core of the 3D NAND.

Each of the pillars is separated from neighboring pillars by a hollow channel in which a plurality of film layers, including at least a lower film layer and an upper film layer have been deposited. The systems and methods described herein beneficially and advantageously remove at least the upper film layer proximate the SGD while maintaining the film layers proximate the memory cells. Such an arrangement beneficially permits tailoring the film layers (e.g., the oxide layers) proximate the SGD prior to depositing the channel film layer in the hollow channel. The systems and methods described herein beneficially permit the deposition of a continuous channel film layer proximate both the memory cells and the SGD. Deposition of a continuous channel film layer improves consistency of the channel film layer thickness, beneficially improving the performance of the 3D NAND structure.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for fabricating a 3D NAND storage device.

According to example 1, there is provided a method of fabricating a three-dimensional NAND (3D NAND) structure. The method may include: disposing a plurality of film layers across at least an interior surface of a hollow channel, the hollow channel having an open first end and a closed second end and including: a plurality of memory cells disposed along at least a portion of a length of the hollow channel; and at least one drain-end select gate (SGD) disposed about the hollow channel; disposing a sacrificial material in the hollow channel; selectively removing the sacrificial material to a first defined depth measured from the first end of the hollow channel, the selective removal of the sacrificial material exposing an upper film layer included in the plurality of film layers; selectively removing at least the exposed upper film layer included in the plurality of film layers to the first defined depth; and removing the sacrificial material from the hollow channel.

Example 2 may include elements of example 1, and the method may additionally include depositing a continuous channel film layer extending from the first end of the channel to the second end of the channel.

Example 3 may include elements of example 2 where depositing a continuous channel film layer that extends from the first end of the channel to the second end of the channel may include: depositing a continuous polysilicon layer extending from the first end of the channel to the second end of the channel Example 4 may include elements of example 2, and the method may additionally include: depositing a continuous channel fill material that extends from the first end of the channel to the second end of the channel.

Example 5 may include elements of example 4 where depositing a continuous channel fill material extending from the first end of the channel to the second end of the channel may include: depositing a continuous dielectric material extending from the first end of the channel to the second end of the channel.

Example 6 may include elements of example 1, and the method may additionally include: planarizing the sacrificial material prior to selectively removing the sacrificial material to the first defined depth.

Example 7 may include elements of example 6 where planarizing the sacrificial material prior to selectively removing the sacrificial material to the first defined depth may include: chemically/mechanically planarizing (CMP) the sacrificial material prior to selectively removing the sacrificial material to the first defined depth.

Example 8 may include elements of example 1 where disposing a sacrificial material in the hollow channel may include: disposing a removeable etch resist compound in the hollow channel.

Example 9 may include elements of example 1 where disposing a sacrificial material in the hollow channel may include: disposing a removeable spin-on dielectric material in the hollow channel.

Example 10 may include elements of example 1 where removing the sacrificial material from the hollow channel may include: selectively removing the sacrificial material from the hollow channel such that the upper film included in the plurality of films remains undamaged.

According to example 11, there is provided a three-dimensional NAND (3D NAND) structure. The structure may include: a plurality of memory cells disposed about at least a portion of a length of a hollow channel, the hollow channel having at least an open first end and a second end; a drain-end select gate (SGD) formed about the hollow channel; a plurality of film layers that includes at least an upper film layer and a lower film layer disposed across at least a portion of an interior surface of the hollow channel; wherein to a first defined depth measured from the first end of the hollow channel, the plurality of film layers comprises the plurality of film layers less the upper film layer; and wherein beyond the first defined depth, the plurality of film layers includes at least the upper film layer and the lower film layer; and a continuous channel film layer that extends from the first end of the channel to the second end of the channel.

Example 12 may include elements of example 11 where the hollow channel may include a hollow channel having an open first end and a closed second end.

Example 13 may include elements of example 11, and the system may further include: a continuous channel fill material that extends from the first end of the hollow channel to the second end of the hollow channel.

Example 14 may include elements of example 13 where the continuous channel fill material may include a continuous polysilicon fill material.

Example 15 may include elements of example 11, where the select gate may include one or more select gates disposed between the first end of the hollow channel and the plurality of memory cells.

Example 16 may include elements of example 11 where the continuous channel film layer comprises a continuous channel film layer having a thickness that varies by less than +/−10% of an average thickness of the continuous channel film.

According to example 17, there is provided a system for fabricating a three-dimensional NAND (3D NAND) structure. The system may include: means for disposing a plurality of film layers across at least an interior surface of a hollow channel, the hollow channel having an open first end and a closed second end and including: a plurality of memory cells disposed along at least a portion of a length of the hollow channel; and at least one drain-end select gate (SGD) disposed about the hollow channel; means for disposing a sacrificial material in the hollow channel; means for selectively removing the sacrificial material to a first defined depth measured from the first end of each of the plurality of hollow channels, the selective removal of the sacrificial material exposing an upper film layer included in the plurality of film layers; means for selectively removing at least the exposed upper film layer included in the plurality of film layers to the first defined depth; and means for removing the sacrificial material from the hollow channel.

Example 18 may include elements of example 17, and the system may additionally include: means for depositing a continuous channel film layer extending from the first end of the channel to the second end of the channel.

Example 19 may include elements of example 18 where the means for depositing a continuous channel film layer that extends from the first end of the channel to the second end of the channel may include: means for depositing a continuous polysilicon layer extending from the first end of the channel to the second end of the channel.

Example 20 may include elements of example 18, and the system may further include: means for depositing a continuous channel fill material that extends from the first end of the channel to the second end of the channel.

Example 21 may include elements of example 20 where the means for depositing a continuous channel fill material extending from the first end of the channel to the second end of the channel may include: means for depositing a continuous dielectric material extending from the first end of the channel to the second end of the channel.

Example 22 may include elements of example 17, and the system may additionally include: means for planarizing the sacrificial material prior to selectively removing the sacrificial material to the first defined depth.

Example 23 may include elements of example 22 where the means for planarizing the sacrificial material prior to selectively removing the sacrificial material to the first defined depth may include: means for chemically/mechanically planarizing (CMP) the sacrificial material prior to selectively removing the sacrificial material to the first defined depth.

Example 24 may include elements of example 17 where the means for disposing a sacrificial material in the hollow channel may include: means for disposing a removeable etch resist compound in the hollow channel.

Example 25 may include elements of example 17 where the means for disposing a sacrificial material in the hollow channel may include: means for disposing a removeable spin-on dielectric material in the hollow channel.

Example 26 may include elements of example 17 where the means for removing the sacrificial material from the hollow channel may include: means for selectively removing the sacrificial material from the hollow channel such that the upper film included in the plurality of films remains undamaged.

According to example 27, there is provided an electronic device. The electronic device may include: a printed circuit board; and a three-dimensional NAND (3D NAND) structure operably coupled to the printed circuit board, the three-dimensional NAND including: a plurality of memory cells disposed about at least a portion of a length of a hollow channel, the hollow channel having an open first end and a closed second end; at least one drain-end select gate (SGD) disposed about the hollow channel; and a plurality of film layers that includes at least an upper film layer and a lower film layer disposed across at least a portion of an interior surface of the hollow channel; where to a first defined depth measured from the first end of the hollow channel, the plurality of film layers comprises the plurality of film layers less the upper film layer; and where beyond the first defined depth, the plurality of film layers includes at least the upper film layer and the lower film layer.

Example 28 may include elements of example 27 where the hollow channel may include a hollow channel having an open first end and a closed second end.

Example 29 may include elements of example 27, and the device may additionally include: a continuous channel fill material that extends from the first end of the hollow channel to the second end of the hollow channel.

Example 30 may include elements of example 29 where the continuous channel fill material may include a continuous polysilicon fill material.

Example 31 may include elements of example 27 where the select gate may include a select gate disposed between the first end of the hollow channel and the plurality of memory cells.

Example 32 may include elements of example 27 where the continuous channel film layer may include a continuous channel film layer having a thickness that varies by less than +/−10% of an average thickness of the continuous channel film.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A three-dimensional NAND (3D NAND) structure, comprising:
   a plurality of memory cells disposed about at least a portion of a length of a hollow channel, the hollow channel having at least an open first end and a closed second end;
   a drain-end select gate (SGD) formed about the hollow channel, the SGD extending from a first depth below the open first end of the hollow channel to a second depth measured from the open first end of the hollow channel;
   a plurality of film layers that includes at least an upper film layer and a lower film layer disposed across at least a portion of an interior surface of the hollow channel;
      wherein to the second depth measured from the first end of the hollow channel, the plurality of film layers comprises the plurality of film layers less the upper film layer; and
      wherein beyond the second depth measured from the first end of the hollow channel, the plurality of film layers includes at least the upper film layer and the lower film layer; and
   a continuous channel film layer;
      wherein the upper film layer, the lower film layer, and the continuous channel film layer extend from the second depth below the open first end of the hollow channel to the second end of the hollow channel and across the closed second end of the hollow channel.

2. The 3D NAND structure of claim 1, further comprising a continuous channel fill material that extends from the first end of the hollow channel to the second end of the hollow channel.

3. The 3D NAND structure of claim 2 wherein the continuous channel fill material comprises a continuous polysilicon fill material.

4. The 3D NAND structure of claim 1, the drain-end select gate (SGD) disposed between the first end of the hollow channel and the plurality of memory cells.

5. The 3D NAND structure of claim 1 wherein the continuous channel film layer comprises a continuous channel film layer having a thickness that varies by less than +/−10% of an average thickness of the continuous channel film layer.

6. An electronic device, comprising:
   a printed circuit board; and
   a three-dimensional NAND (3D NAND) structure operably coupled to the printed circuit board, the 3D NAND including:
      a plurality of memory cells disposed about at least a portion of a length of a hollow channel, the hollow channel having at least an open first end and a closed second end;
      a drain-end select gate (SGD) formed about the hollow channel, the SGD extending from a first depth below the open first end of the hollow channel to a second depth measured from the open first end of the hollow channel;
      a plurality of film layers that includes at least an upper film layer and a lower film layer disposed across at least a portion of an interior surface of the hollow channel;
         wherein to the second depth measured from the first end of the hollow channel, the plurality of film layers comprises the plurality of film layers less the upper film layer; and
         wherein beyond the second depth measured from the first end of the hollow channel, the plurality of film layers includes at least the upper film layer and the lower film layer; and
      a continuous channel film layer;
         wherein the upper film layer, the lower film layer, and the continuous channel film layer extend from the second depth below the open first end of the hollow channel to the second end of the hollow channel and across the closed second end of the hollow channel.

7. The electronic device of claim 6, further comprising a continuous channel fill material that extends from the first end of the hollow channel to the second end of the hollow channel.

8. The electronic device of claim 7 wherein the continuous channel fill material comprises a continuous polysilicon fill material.

9. The electronic device of claim 6, the SGD disposed between the first end of the hollow channel and the plurality of memory cells.

* * * * *